United States Patent
McGuire et al.

(10) Patent No.: US 8,852,775 B2
(45) Date of Patent: Oct. 7, 2014

(54) INDUSTRIAL PROCESS FIELD DEVICE WITH ENERGY LIMITED BATTERY ASSEMBLY

(75) Inventors: Chad M. McGuire, Minneapolis, MN (US); James Johnson, Savage, MN (US)

(73) Assignee: Rosemount Inc., Eden Prairie, MN (US)

( * ) Notice: Subject to any disclaimer, the term of this patent is extended or adjusted under 35 U.S.C. 154(b) by 1063 days.

(21) Appl. No.: 11/708,411

(22) Filed: Feb. 20, 2007

(65) Prior Publication Data

US 2007/0201192 A1 Aug. 30, 2007

Related U.S. Application Data

(60) Provisional application No. 60/775,417, filed on Feb. 21, 2006.

(51) Int. Cl.
| | |
|---|---|
| H01M 2/10 | (2006.01) |
| H01M 10/42 | (2006.01) |
| G01L 19/14 | (2006.01) |
| H01M 2/34 | (2006.01) |
| H01R 24/68 | (2011.01) |
| H05K 7/14 | (2006.01) |
| H01M 16/00 | (2006.01) |
| H01R 103/00 | (2006.01) |
| H02H 9/00 | (2006.01) |

(52) U.S. Cl.
CPC .......... *H01M 2/1022* (2013.01); *H01M 10/425* (2013.01); *G01L 19/14* (2013.01); *H01M 2/1055* (2013.01); *H01M 2/34* (2013.01); *H01M 16/00* (2013.01); *H01R 24/68* (2013.01); *H01R 2103/00* (2013.01); *H02H 9/008* (2013.01); *H05K 7/1462* (2013.01)
USPC ................ 429/97; 429/96; 429/100; 702/184

(58) Field of Classification Search
USPC ................ 455/572; 702/184; 429/96, 97, 100
See application file for complete search history.

(56) References Cited

U.S. PATENT DOCUMENTS

| | | | | |
|---|---|---|---|---|
| 4,597,620 A | * | 7/1986 | Lindner et al. ................. | 439/277 |
| 4,638,396 A | | 1/1987 | Mukli et al. ................... | 361/101 |

(Continued)

FOREIGN PATENT DOCUMENTS

| | | |
|---|---|---|
| EP | 1 596 461 | 11/2005 |
| EP | 1596461 | 11/2005 |

(Continued)

OTHER PUBLICATIONS

Official Communication from corresponding Chinese Application No. 200780014423.7, dated Apr. 13, 2010.

(Continued)

*Primary Examiner* — Zachary Best
(74) *Attorney, Agent, or Firm* — Westman, Champlin & Koehler, P.A.

(57) ABSTRACT

An industrial process field device has a housing with a wall. The wall has a feedthrough opening between a battery compartment and an electronics compartment. A feedthrough connector seals the feedthrough opening and includes a power connector connected to industrial process field device electronics. A battery assembly includes a battery housing with a battery connector, and includes a battery and an energy limiter connected to the battery connector. The battery connector mates with the power connector to energize the industrial process field device electronics. A seal seals the mating connection of the power connector and the battery connector.

26 Claims, 8 Drawing Sheets

(56) References Cited

U.S. PATENT DOCUMENTS

| | | |
|---|---|---|
| 4,749,934 A | 6/1988 | Alexander et al. ............ 320/135 |
| 5,707,757 A | 1/1998 | Lee |
| 5,899,962 A * | 5/1999 | Louwagie et al. ............ 702/138 |
| 5,952,762 A | 9/1999 | Larsen et al. ................. 310/232 |
| 6,111,519 A * | 8/2000 | Bloss et al. .............. 340/870.02 |
| 6,722,927 B1 | 4/2004 | Eriksen et al. ................ 439/736 |
| 6,839,546 B2 * | 1/2005 | Hedtke ...................... 455/67.11 |
| 6,925,419 B2 * | 8/2005 | Duren et al. ................. 702/184 |
| 2002/0051550 A1 * | 5/2002 | Leysieffer .................... 381/322 |
| 2002/0065631 A1 * | 5/2002 | Loechner ..................... 702/188 |
| 2002/0098730 A1 | 7/2002 | Babala et al. ................. 439/248 |
| 2002/0176671 A1 * | 11/2002 | Tourne ............................ 385/88 |
| 2005/0110456 A1 | 5/2005 | Jeong ............................ 320/111 |
| 2006/0024107 A1 * | 2/2006 | Lyman et al. ................... 400/88 |
| 2006/0239777 A1 * | 10/2006 | Martin .................... 405/128.15 |

FOREIGN PATENT DOCUMENTS

| | | |
|---|---|---|
| JP | 9007562 A | 1/1997 |
| JP | 2001210288 A | 8/2001 |
| JP | 2007504713 A | 3/2007 |
| RU | 2181880 | 5/1996 |
| WO | 2005024570 A2 | 3/2005 |

OTHER PUBLICATIONS

"Notification of Transmittal of the International Search Report and the Written Opinion of the International Searching Authority, or the Declaration" for PCT/US2007/004543 filed Feb. 20, 2007; 6 pages.
"Written Opinion of the International Searching Authority" for PCT/US2007/004543 filed Feb. 20, 2007; 8 pages.
Official Communication from corresponding European Application No. 07751313.3-2119, dated Jun. 29, 2009.
Translated Decision on Grant from corresponding Russian Application No. 2008137620, dated Dec. 21, 2010.
Japanese Office Action for corresponding Japanese Patent Application No. 2008-556413, dated Mar. 13, 2013 and translation.
English translation of Rejection Notice for Japanese Application No. JP 2008-556413, date drafted Jul. 9, 2012, 2 pages.
Canadian Office Action for corresponding Canadian Patent Application No. 2,643,051, dated Dec. 20, 2011, 2 pages.
Translated Official Communication from corresponding Russian Application No. 2008137620/07(048435) dated Oct. 28, 2010.

* cited by examiner

INDUSTRIAL PROCESS FIELD DEVICE WITH ENERGY LIMITED BATTERY ASSEMBLY

CROSS-REFERENCE TO RELATED APPLICATION

The present application is based on and claims the benefit of U.S. provisional patent application Ser. No. 60/775,417, filed Feb. 21, 2006, the content of which is hereby incorporated by reference in its entirety.

BACKGROUND OF THE INVENTION

The present invention relates to industrial processes. More specifically, the invention relates to industrial process field devices for use in monitoring or control of industrial processes.

In many industrial process environments, combustible atmospheres are present in the environmental space surrounding industrial transmitters. A high power spark from connection or disconnection of a battery has a potential to ignite the combustible atmosphere.

In many industrial process environments, corrosive dust, liquids or mists are present which can damage electronic circuitry. Electronic circuitry is typically enclosed in a sealed electronic compartment. However, when such compartments are opened to replace a battery and then resealed, there is a potential to contaminate battery contacts or to seal corrosive chemicals inside the electronics compartment causing long term degradation of the electronics. On the other hand, batteries installed outside the transmitter housing are also subject to corrosion.

Circuits inside a transmitter typically carry enough electrical energy to spark and ignite a combustible atmosphere under accidental short circuit or fault conditions. Special precautions are thus taken before opening a transmitter electronics compartment. Either the surrounding environment is cleared of combustible vapors, the cable providing power to the transmitter is deenergized, or both. To increase safety, organizations require "hot work permits" and specially trained personnel before a transmitter is opened in an area where combustible atmospheres are sometimes present.

In many industrial process environments, there is severe vibration of pipes and tanks upon which transmitters are mounted. Ordinary battery connectors such as clips and snaps can shake loose in such an environment causing the transmitter to stop functioning.

Modern replaceable cells and batteries typically have a relatively high mass. Under high vibration conditions, the forces on the battery due to acceleration are significant, and cracking can take place in battery mounting structures, particularly when such structures are formed of plastic resin. Any relative motion in the battery connection will eventually cause wear and could lead to failure.

While cells and batteries can provide low current levels under ordinary operating conditions, batteries and cells typically produce very high short circuit currents under fault conditions. A typical fault condition is a short circuit in a circuit that is external to the cell or battery. In addition, cells and batteries have a large energy storage capacity or equivalent electrical capacitance C. The high short circuit currents under fault conditions and the large energy storage capacity are typically incompatible with intrinsically safe circuit specifications. It is thus difficult to mount cells or batteries outside from the transmitter housing and run a battery cable through a combustible atmosphere between the transmitter and the battery. Such a battery cable would typically violate intrinsically safe circuit requirements.

Similar difficulties are encountered with other types of battery powered industrial process field devices. A method and apparatus are needed for providing battery powered industrial process field devices that have a wide range of applicability in industrial process environments, particularly when such environments include a combination of combustible atmospheres, corrosive chemicals and vibration.

SUMMARY

In the embodiments described below, an industrial process field device is disclosed. The industrial process field device comprises a housing. The housing includes a wall with a feedthrough opening between a battery compartment and an electronics compartment. The electronics compartment houses industrial process field device electronics.

The industrial process field device further includes a feedthrough connector. The feedthrough connector seals the feedthrough opening and includes a power connector connected to the industrial process field device electronics.

The industrial process field device further comprises a battery assembly in the battery compartment. The battery assembly includes a battery housing with a battery connector. The battery assembly further includes a battery and an energy limiter connected to the battery connector. The battery connector mates with the power connector to energize the industrial process field device electronics.

The industrial process field device includes a seal that seals the mating connection of the power connector and the battery connector.

DETAILED DESCRIPTION

Field devices, such as transmitters, used in industrial processes can be installed in the field on pipelines, tanks and other industrial process equipment. Transmitters sense process variables such as process pressure, process flow, process fluid temperature, process fluid conductivity, process fluid pH and other process variables. Other types of industrial process field devices include valves, actuators, field controllers, data displays and communication equipment such as industrial field network bridges.

Some industrial process field devices have no cabled connection to electrical power and rely on an internal battery for power. Wireless transmitters transmit outputs representing the process variables over a wireless communication channel to control or monitor equipment that is remote from the wireless transmitters. The control or monitoring equipment is typically located in a control room. The wireless transmitter typically includes an antenna used for wireless transmission with a control room antenna or other wireless network device such as a gateway. Use of wireless communication avoids connecting a communication or power cable between the transmitter and the control room.

Wireless transmitters typical include electronic circuits that require only small amounts of power for operation. The amount of power required is so low that small replaceable primary cells could be considered to provide the power. There are, however, difficult problems associated with the industrial process environment that limit general, widespread use of internal batteries in that environment.

In the embodiments described below in connection with FIGS. 2-8, battery powered industrial process field devices with a wide range of applicability in industrial process environments with combustible atmospheres, corrosive chemicals and vibration are provided.

Figure 1:
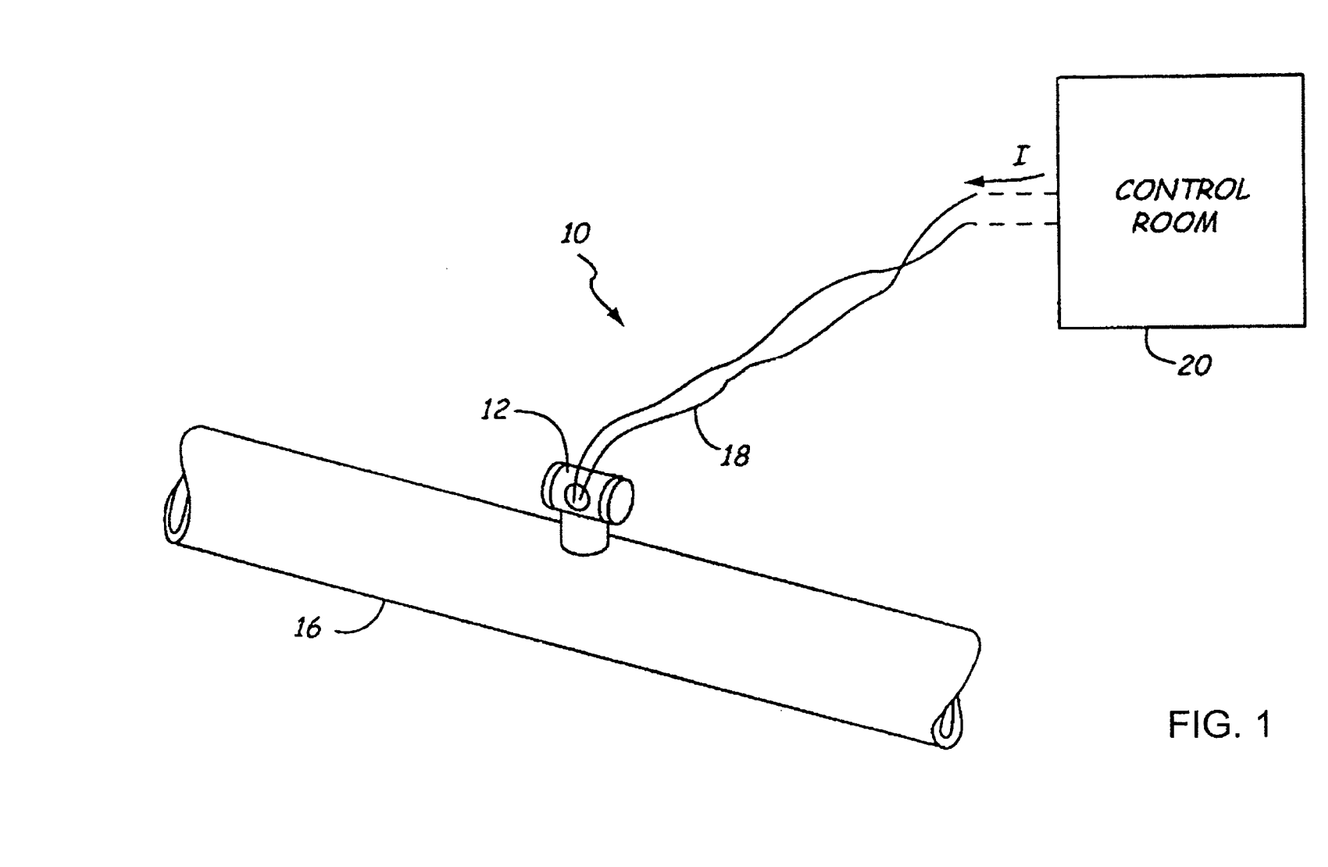
FIG. 1 illustrates a pressure transmitter mounted to a pressurized process pipe.

FIG. 1 is a diagram of process control system 10 which includes a pressure transmitter 12 connected to a pressurized process pipe 16. Pressure transmitter 12 is coupled to a two-wire process control loop 18 which operates in accordance with a desired protocol such as the HART® standard, a 4-20 milliamperes analog standard or other known process control communication standard. Two-wire process control loop 18 runs between pressure transmitter 12 and a remotely located control room 20. In an embodiment in which loop 18 operates in accordance with the HART® protocol, loop 18 can carry a current I which is representative of a sensed process pressure and which also provides all of the energization for pressure transmitter 12. In some applications, there are disadvantages to use of the two-wire process control loop 18 to energize the transmitter 12. In such applications, the wired process control loop 18 is not used, and transmitter 12 is instead energized by a cell or battery and uses wireless communication as described below in connection with FIGS. 2-8.

Figure 2:
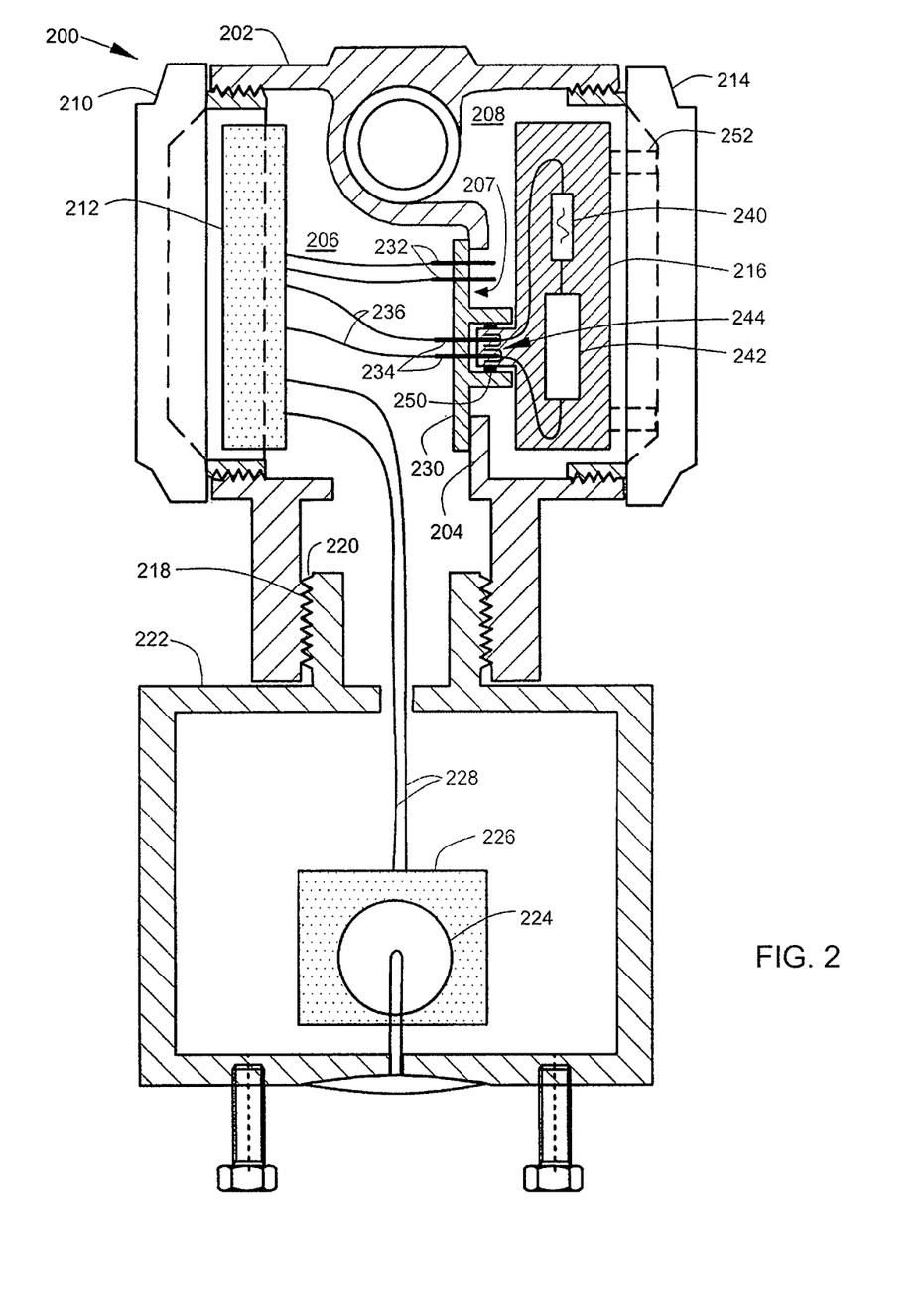
FIG. 2 illustrates a cross-sectional view of a pressure transmitter.

FIG. 2 illustrates an embodiment of an industrial process field device 200 that senses pressure. The industrial process field device 200 comprises a housing 202. The housing 202 comprises a wall 204 between an electronics compartment 206 and a battery compartment 208. The wall 204 includes a feedthrough opening 207. In this embodiment, a first housing cover 210 is generally round and has threads that screw into threads on the housing 202 to enclose industrial process instrument or field device electronics 212 in the electronics compartment 206. A second housing cover 214 is generally round and has threads that screw into threads on the housing 202 to enclose a battery assembly 216 in the battery compartment 208. Industrial process field device electronics 212 generally comprise electronic circuits that are energy limited and that have temperature, reliability and vibration resistant characteristics that make them suitable for use in monitoring and controlling industrial processes in process plants such as chemical plants, petroleum refineries and the like. The field device electronics may include communication circuitry for communicating wirelessly with a process control loop.

The housing 202 has threads 218 that thread onto threads 220 of a pressure sensor housing 222. The pressure sensor housing 222 encloses a pressure sensor 224 and sensor circuitry 226. Electrical leads 228 from sensor circuitry 226 connect to the industrial process field device electronics 212. In one embodiment, the housing 202 and the housing covers 210, 214 comprise metal die castings.

In this embodiment, a feedthrough connector 230 is mounted to the feedthrough wall 204. The feedthrough connector 230 includes sealed electrical connections 232 that preferably extend through the feedthrough wall 204. The feedthrough connector 230 includes power connectors 234 and 236 that connect power to industrial process field device electronics 212. The wall 204 and the feedthrough connector 230 seal the feedthrough opening between the battery compartment 208 and the electronics compartment 206. The battery compartment 208 can be opened in a corrosive process environment and the corrosive process environment is blocked from leaking into the electronics compartment by the feedthrough wall 204 and the feedthrough connector 230. In one embodiment, the feedthrough connector 230 comprises an injection molded plastic part that includes metal electrical connections that are molded into the plastic.

The battery assembly 216 is electrically connected to the power connectors 234 and 236. The battery assembly 216 comprises an energy limiter 240 and at least one cell 242. The energy limiter can comprise a picofuse, a fuse or an electronic circuit that limits energy. In one embodiment, the series energy limiter 240 limits energy to an intrinsic safety level at an electrical connection 244 between the battery assembly 216 and the power connectors 234 and 236. The connection 244 comprises an intrinsically safe circuit. An intrinsically safe circuit is a circuit in which no spark or thermal effect that is produced under test conditions (which include normal operations and specified fault conditions) is capable of causing ignition of a given explosive atmosphere surrounding the connection 244. The current limit of the series current limiter 240 is calculable for a particular combustible gas (such as methane) and particular circuit characteristics (such as circuit capacitance and inductance) using known methods. In one embodiment, redundant intrinsic safety protection is provided by using two energy limiters instead of a single energy limiter 240.

A seal 250 surrounds the electrical connection 244 between the battery assembly 216 and the power connectors 234 and 236. The seal 250 preferably comprises an O-ring seal that is mounted to the battery assembly 216 and that slidingly engages the feedthrough connector 230 when the battery assembly 216 is removed or installed. The cover 214 preferably engages the battery assembly 216 along a circular contact ring 252 to provide mechanical support that is especially useful in high vibration environments.

Figure 3:
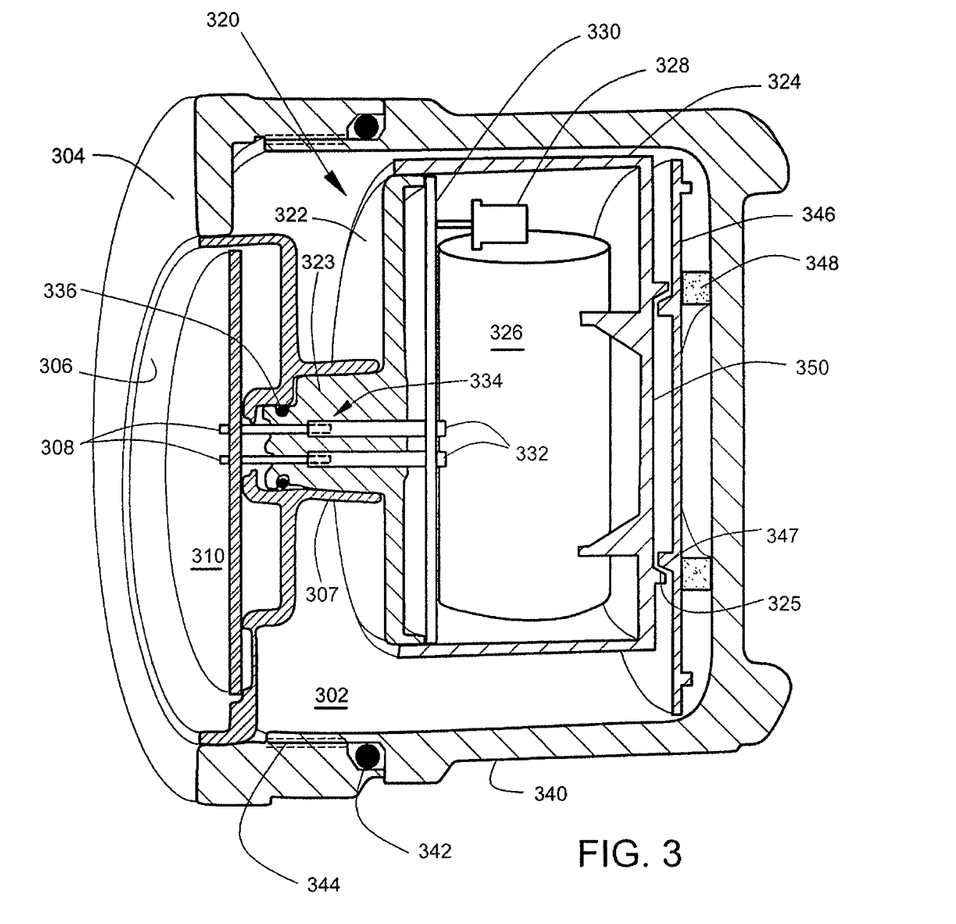
FIG. 3 illustrates a cross-sectional view of a battery compartment.

FIG. 3 illustrates a cross-sectional view of a battery compartment 302 of an industrial process field device according to one embodiment of the invention. A feedthrough wall portion of a field device housing 304 separates the battery compartment 302 from an electronics compartment. A feedthrough connector 306 is sealed to the feedthrough wall portion of instrument housing 304. Alternatively, the feedthrough connector could be integrally formed with a portion of the housing. The feedthrough connector 306 preferably comprises a plastic resin shroud and includes a sealed electrical power connector 308. The contacts of the electrical power connector are recessed in a shroud 307 to meet the IP20 per IEC 529 standard. The electrical power connector 308 is mounted to a circuit card assembly 310 in the electronics compartment. The circuit card assembly 310 is sealed to the feedthrough connector 306 around the electrical power connector 308. In one embodiment, the feedthrough connector is potted with an appropriate material.

In this embodiment, a battery assembly 320 is placed in the battery compartment 302. The battery assembly 320 comprises a housing base 322 and a housing cap 324 that enclose a cell 326 (or cells 326) and a series current limiter 328 (or multiple series current limiters 328). The housing base includes a molded connector body 323.

In one embodiment, the molded connector body 323 comprises a protruding plug that protrudes from the battery housing base 322. Electrical battery contacts 332 are recessed in the molded connector body 323 and are protected from mechanical damage during handling. The shroud 307 comprises a protruding socket that protrudes from the feedthrough connector 306. The power connector 308 comprises two pins that are recessed in the shroud 307 and are protected from mechanical damage. The engagement of the connection is a sliding connection that is easily put together or taken apart in the field after the cover 340 is removed.

Other intrinsic safety protection devices such as voltage limiting diodes can also be included in the battery assembly 320. The cell 326 and the series current limiter 328 are preferably mounted to a printed wiring board 330. The battery assembly includes electrical contacts 332 that electrically connect to the power connector 308 at an electrical connection 334. The series current limiter 328 limits energy to an intrinsic safety level at the electrical connection 334. A seal 336 surrounds the electrical connection 334.

In one embodiment, the molded connector body 323 has an external taper, and the connector on the shroud 307 has an internal taper, and there is a tapered fit between the molded connector body 323 and the connector on the shroud 307. The tapered fit is a tight fit so that vibration does not cause relative motion between the shroud 307 and the connector body 323. The tapered fit allows the battery contacts 332 to be pre-aligned with the power connector 308 while sliding the molded connector body 323 into the shroud 307. This pre-alignment prevents bending or other damage to the power connector 308.

A cover 340 preferably includes threads 344 for screwing the cover 340 to the instrument housing 304. A seal 342 seals the cover 340 to the housing 340. Inside the cover 340, a thrust bearing assembly preferably includes a thrust bearing plate 346 and a resilient compression ring 348. The thrust bearing plate 346 presses against a top surface 350 of the battery assembly housing 320. The thrust bearing plate 346 rotates relative to the top surface 350 as the cover 340 is screwed on. The compression ring 348 is compressed as the cover 340 is screwed on. The cover 340 is removably attachable to the housing 340 and presses the battery assembly 320 toward the power connector 308. The screw down cover 340 presses down on the battery assembly 320 to maintain battery assembly connection during extreme vibration. In one embodiment the thrust bearing plate 346 includes a protruding ring 347 that has a tapered fit to a ring 325 on the housing cap 324. The tapered fit eliminates relative motion between the thrust bearing plate 346 and the housing cap 324 during vibration.

Figure 4:
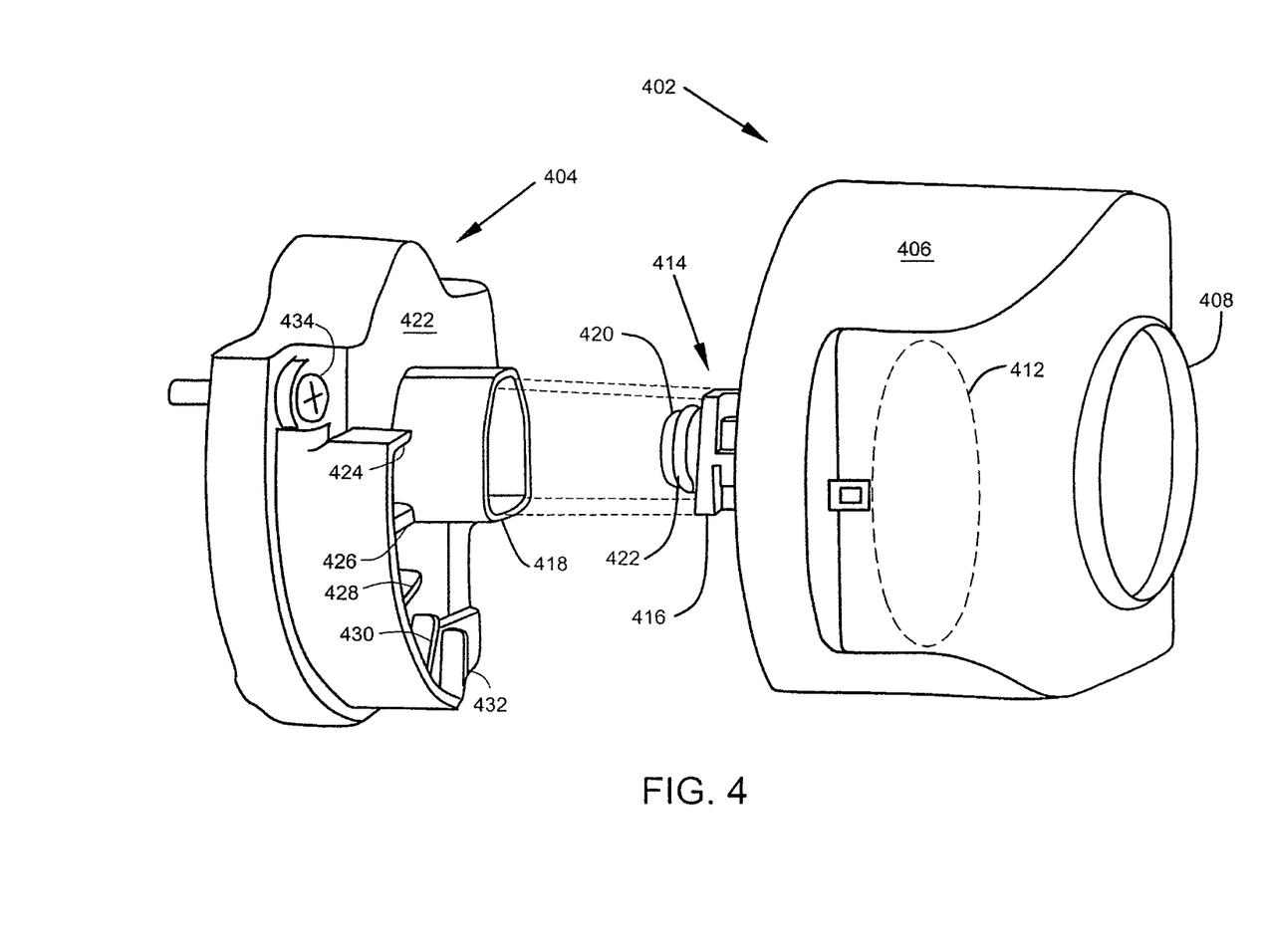
FIG. 4 illustrates an exploded view of a battery assembly and a feedthrough connector.

FIG. 4 illustrates an exploded view of a battery assembly 402 and a feedthrough connector 404 according to one embodiment of the present invention. The battery assembly 402 comprises an outer plastic resin housing 406 that includes a circular protruding ring 408. The ring 408 is positioned to engage a mating circular protruding ring on a thrust bearing plate (such as thrust bearing plate 346 in FIG. 3). The circular shape of the ring 408 permits the mating circular rings to rotate or slide past one another as a cover (such as cover 340 in FIG. 3) is screwed on. The engagement of the circular protruding rings provides support to the battery assembly 402.

The plastic resin housing 406 includes two opposed finger gripping surfaces 412, only one of which is visible in FIG. 4. The finger gripping surfaces 412 permit a technician to conveniently pull the battery assembly 402 to remove it from an industrial field device in which it is installed.

In one embodiment, the plastic resin housing 406 includes a protruding molded connector body 414. The connector body 414 preferably includes a polarizing rim 416. The polarizing rim 416 slides into a correspondingly shaped polarizing shell 418 on the feedthrough connector 404. The polarizing rim 416 and shell 418 have a shape that is rotationally asymmetric to provide polarization. The polarizing rim 416 slides into the polarizing shell 418 in a single, unique orientation. The plastic resin housing 406 also includes a protruding molded round seal body 420. The seal body 420 is rotationally symmetric and includes an O-ring groove that holds an O-ring seal 422. The O-ring seal 422 slides into a cylindrical cavity in the feedthrough connector 404. Electrical power connection pins (not visible in FIG. 4) are arranged inside the seal body 420 for mating with power connections (not visible in FIG. 4) inside the polarizing shell 418.

According to one embodiment, the feedthrough connector 404 comprises a plastic resin body 422. The resin body 422 comprises barrier walls 424, 426, 428, 430, 432 that separate screw terminals (not visible in FIG. 4). The screw terminals provide connections to field wiring. Mounting screws 434 (only one of which is visible in FIG. 4) pass through the feedthrough connector 404. The mounting screws 434 are used to secure the feedthrough connector 404 to a feedthrough wall that is part of an instrument housing (not shown in FIG. 4). The polarizing shell 418, which is part of the resin body 422, supports the battery assembly 402. The battery assembly 402 is supported at one end by the polarizing shell 418 and supported at an opposite end by the ring 408. The battery assembly 402 is compressed by a thrust assembly (not shown in FIG. 4). The motion of the battery assembly 402 relative to the feedthrough connector 404 is highly restricted by the multiple supports and the cover compression to ensure reliable power connection.

Figure 5:
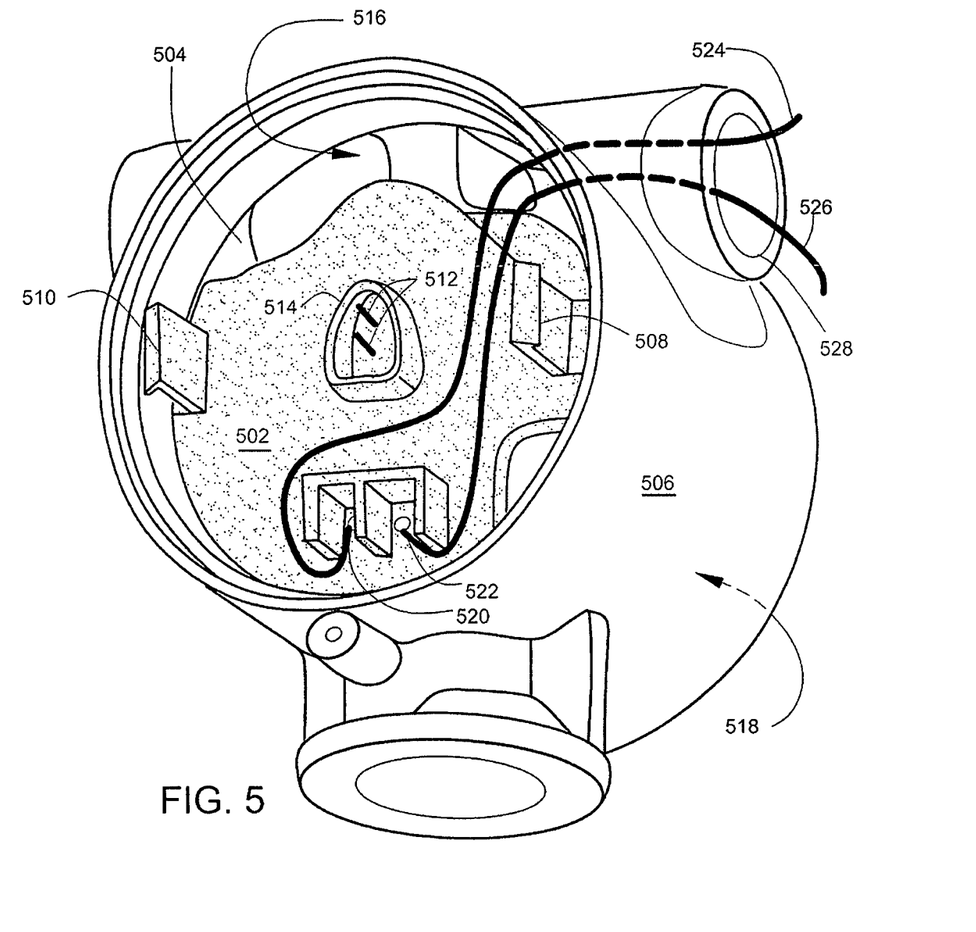
FIG. 5 illustrates a feedthrough connector mounted to a feedthrough wall of a housing of an industrial process field device.

FIG. 5 illustrates a feedthrough connector 502 mounted to a feedthrough wall 504 of a housing 506 of an industrial process field device. The feedthrough connector 502 comprises latches 508, 510 which engage slots in a battery assembly (not illustrated in FIG. 5) for supporting the battery assembly. In one embodiment, screws are used as an alternative to latches 508, 510. The feedthrough connector 502 comprises a power connector 512 that is arranged inside a polarizing shell 514. The feedthrough connector 502 is positioned in a battery compartment 516, and portions of the feedthrough connector 502 extend through the feedthrough wall 504 into an electronics compartment 518. The feedthrough connector 502 includes field wiring terminals 520, 522. The terminals 520, 522 are connectable to leads 524, 526 that pass through threaded conduit entry hub 528 to other devices, for example, a solar array (not illustrated in FIG. 5).

Figure 6:
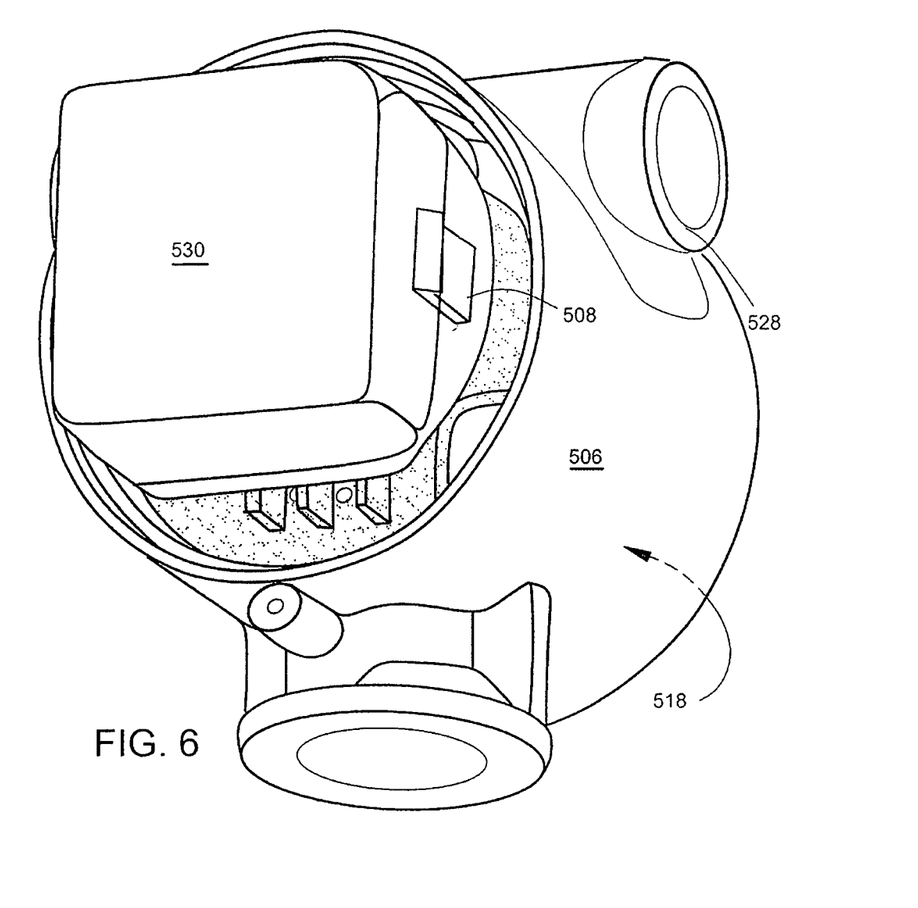
FIG. 6 illustrates the feedthrough connector of FIG. 5 with a battery assembly installed.

FIG. 6 illustrates the feedthrough connector of FIG. 5 with a battery assembly 530 installed and latched in place. Reference numbers used in FIG. 6 that are the same as reference numbers used in FIG. 5 identify the same features. The battery assembly 530 is held in place by latches 508, 510 (FIG. 5).

Figure 7:
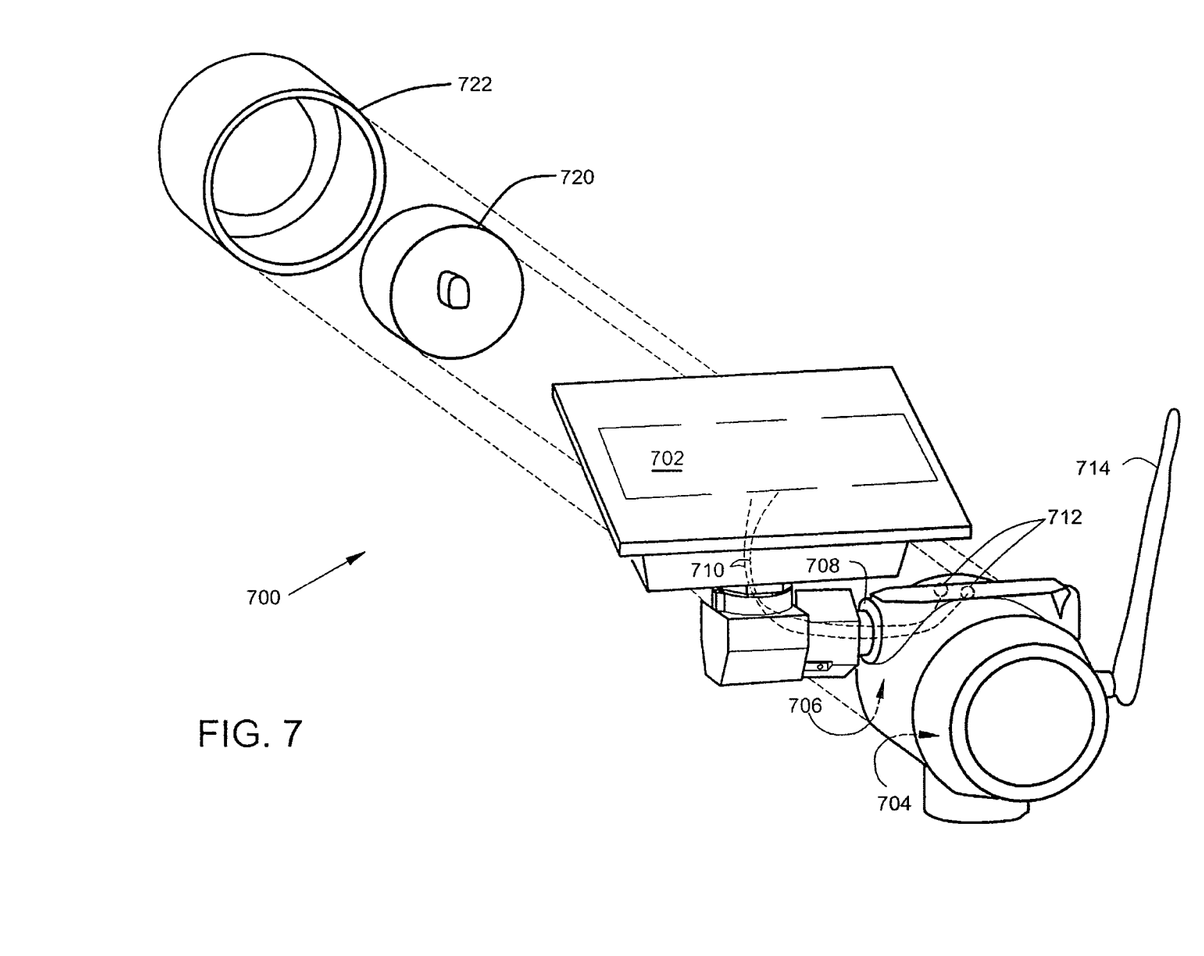
FIG. 7 illustrates an industrial process field device that comprises a solar array.

FIG. 7 illustrates an exploded view of one embodiment of an industrial process field device 700 that further comprises a solar array 702. The industrial process field device 700 includes an electronics compartment 704 and a field wiring compartment 706. A threaded conduit entry hub 708 provides an opening to the field wiring compartment 706. A battery assembly 720 is installed in the field wiring compartment. The solar array 702 is mounted to the threaded conduit entry hub 708. Power leads 710 extend from the solar array 702 through the conduit entry hub 708 to screw terminals 712 on a feedthrough connector (not illustrated in FIG. 7) in the field wiring compartment 706. A screw-on cover 722 holds the battery assembly 720 in place inside the field wiring compartment 706. In one embodiment, the battery assembly 720 comprises a rechargeable sealed lead acid battery, and the solar array 702 serves as a trickle charger that charges the battery assembly 720. The battery assembly 720 can have a mechanical arrangement similar to that shown in FIG. 4. In one embodiment, the molded connector body and shroud for the sealed lead acid battery have mating shapes (polarizing shapes) that are different from the shapes of connector bodies and shrouds for non-rechargeable battery assemblies to preclude inserting the wrong type of battery in a field device.

In one embodiment, industrial process field device electronics in the electronics compartment 704 include a wireless field data transceiver circuit that connects to a wireless communication antenna 714. In one embodiment, the field data transceiver circuit communicates as a cell phone.

Figure 8:
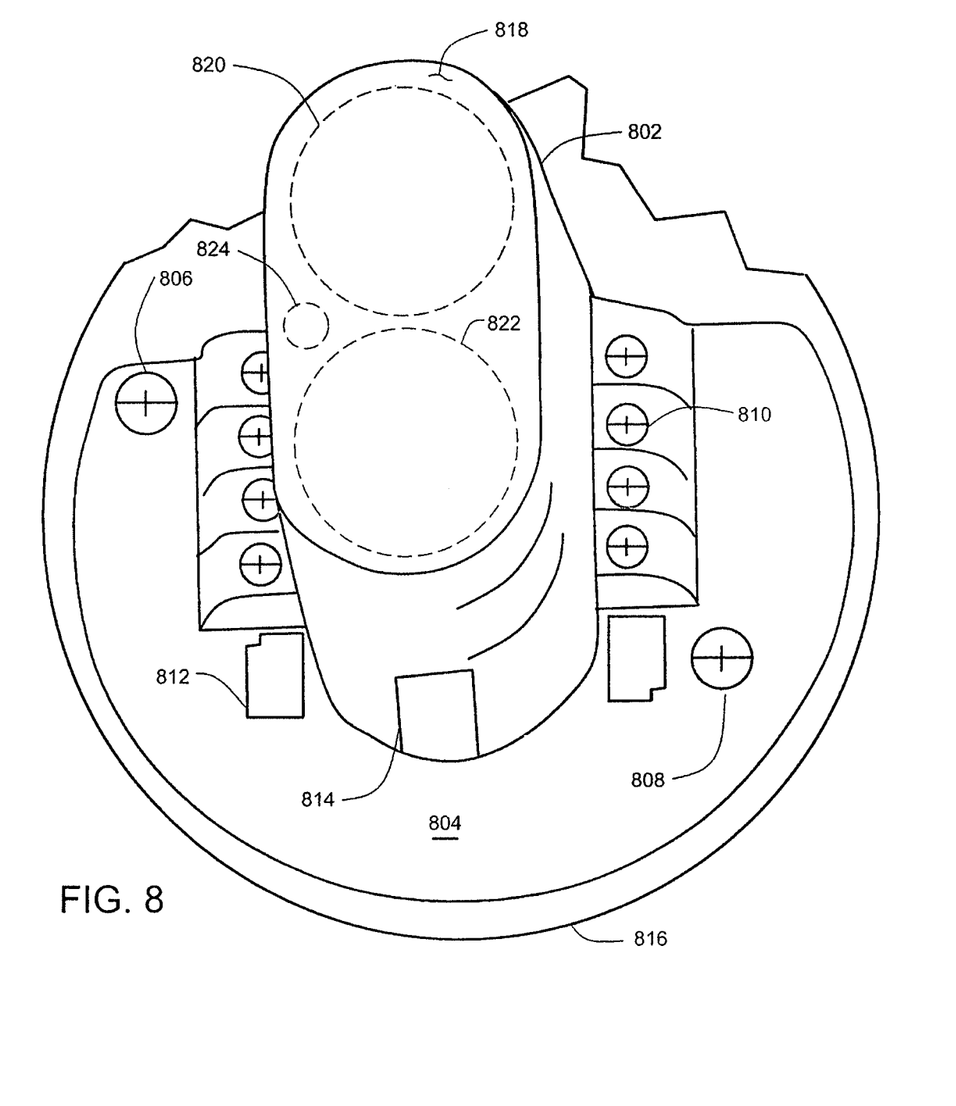
FIG. 8 illustrates a feedthrough connector with a battery assembly installed.

FIG. 8 illustrates a feedthrough connector 804 with a battery assembly 802 electrically connected to a power connector (not visible in FIG. 8 and similar to power connector 308 in FIG. 3) on the feedthrough connector 804. A latch 814 secures the battery assembly 802 to the feedthrough connector 804. The feedthrough connector 804 includes mounting screws 806, 808 for securing the feedthrough connector to a feedthrough wall 816. The battery assembly 802 includes a generally flat top surface 818 which can receive a securing force from a thrust bearing mounted to a housing cover (not illustrated in FIG. 8 and similar to cover 340 in FIG. 3). The battery assembly 802 has a generally cylindrical shape with a flattened oval cylindrical cross-section. The shape of the battery assembly 802 encloses two round cylindrical cells 820, 822 and a series current limiter 824 with a high assembling density. The flattened shape of battery assembly 802 leaves space in a round battery compartment for convenient access to multiple screw terminals 810 and multiple connectors 812 without removing the battery assembly 802. The feedthrough connector 804 provides sealed electrical connection (not visible in FIG. 8 and similar to connection 334 in FIG. 3) that extends through the feedthrough wall 816.

In the embodiments described above in FIGS. 2-8, the battery assembly comprises at least one electrical cell electrically connected in series with a series current limiter. The arrangement is useful with a wide variety of industrial process field devices including process control network bridges, data displays, field control valves, mechanical actuators, field controllers and transmitters. In one embodiment, the electrical cells comprise primary cells. In some embodiments, the battery assembly comprises two cells connected in series with a fuse. In one embodiment, the battery assembly is designed to have an open circuit voltage of at least 3 volts. In other embodiments, particularly single cell embodiments, open circuit voltages lower than 3 volts are used.

In one embodiment, removal of the battery is interlocked with actuation of a series switch in the battery assembly that disconnects the cells such that the power connections are not energized when the battery assembly is removed. When the switch is "on," the battery assembly cannot be disconnected. The switch can also be used to switch off the battery assembly during shipment.

Although the present invention has been described with reference to preferred embodiments, workers skilled in the art will recognize that changes may be made in form and detail without departing from the spirit and scope of the invention.

What is claimed is:

1. An industrial process field device, comprising:
    a housing that includes a wall with a feedthrough opening which extends between a battery compartment and an electronics compartment that houses industrial process field device electronics;
    a feedthrough connector that seals the feedthrough opening and that includes a power connector connected to the industrial process field device electronics, the feedthrough connector including a polarizing shell that surrounds contacts of the power connector that are accessible in the battery compartment;
    a battery assembly in the battery compartment, the battery assembly including a battery housing with a battery connector that includes a molded connector body that protrudes into the polarizing shell and electrical battery contacts that engage the contacts of the power connector in the polarizing shell, and including a battery and an energy limiter connected to the battery connector, the battery connector mating with the power connector to energize the industrial process field device electronics; and
    a seal that seals the mating connection of the polarizing shell and the molded connector body.

2. The industrial process field device of claim 1, and further comprising a housing cover that is removably attachable to the housing and that presses the battery assembly toward the power connector.

3. The industrial process field device of claim 2 wherein the housing cover comprises a screw-down cover that includes a rotational thrust bearing assembly that is compressed as the screw-down cover is screwed onto the housing.

4. The industrial process field device of claim 3 wherein the thrust bearing assembly comprises a ring with a first tapered surface, and the battery assembly comprises a ring with a second tapered surface that engages the first tapered surface.

5. The industrial process field device of claim 1 wherein the industrial process field device comprises a transmitter.

6. The industrial process field device of claim 1 wherein the industrial process field device comprises a wireless field device.

7. The industrial process field device of claim 1 wherein the battery comprises at least one electrical cell electrically connected in series with the energy limiter.

8. The industrial process field device of claim 7 wherein the energy limiter comprises a fuse.

9. The industrial process field device of claim 7 wherein the battery comprises two cells connected in series.

10. The industrial process field device of claim 1 wherein an open circuit output voltage of the battery is at least 3 volts.

11. The industrial process field device of claim 1 wherein the battery housing and feedthrough connector include a latch mechanism that retains the battery housing connected to the feedthrough connector.

12. The industrial process field device of claim 1 wherein the feedthrough connector comprises screw terminals and the battery compartment is configured as a field wiring compartment.

13. The industrial process field device of claim 12 wherein the field wiring compartment comprises a threaded conduit entry hub, a solar array mounted to the threaded conduit entry hub, and leads from the solar array passing through the threaded conduit entry hub to the screw terminals, and the battery comprises a rechargeable battery.

14. The industrial process field device of claim 1 wherein the feedthrough connector comprises a circuit card assembly providing interconnections between the power connector and the industrial process field device electronics, and a plastic resin shroud covering the circuit card assembly.

15. The industrial process field device of claim 14 wherein the feedthrough connector is potted.

16. The industrial process field device of claim 1 wherein the industrial process field device comprises a process control network bridge that is energized by the battery assembly.

17. The industrial process field device of claim 1 wherein the industrial process field device comprises a data display that is energized by the battery assembly.

18. The industrial process field device of claim 1 wherein the industrial process field device comprises a field control valve that is energized by the battery assembly.

19. The industrial process field device of claim 1 wherein the industrial process field device comprises a mechanical actuator that is energized by the battery assembly.

20. The industrial process field device of claim 1 wherein the industrial process field device comprises a field controller.

21. The industrial process field device of claim 1 wherein the battery assembly comprises a polarized plug to ensure correct polarity of connection to the battery assembly.

22. The industrial process field device of claim 1 wherein the battery assembly includes a switch that de-energizes the power connection.

23. The industrial process field device of claim 1 wherein the molded connector body is surrounded by a tapered connector body portion and the feedthrough connector comprises a shroud with a tapered shroud portion that engages the tapered connector body portion.

24. The industrial process field device of claim 1 wherein the battery connector slidingly engages the power connector and a housing cover secures the sliding engagement.

25. The industrial process field device of claim 1, wherein the energy limiter is configured to limit energy to an intrinsic safety level between the battery assembly and the power connector.

26. The industrial process field device of claim 1, wherein the industrial process field device electronics is configured to monitor or control an industrial process.

* * * * *